United States Patent
Lee et al.

(10) Patent No.: US 6,822,257 B2
(45) Date of Patent: Nov. 23, 2004

(54) ORGANIC LIGHT EMITTING DIODE DEVICE WITH ORGANIC HOLE TRANSPORTING MATERIAL AND PHOSPHORESCENT MATERIAL

(75) Inventors: Yung-Chih Lee, Taipei (TW); Wei-Su Chen, Hsinchu Hsien (TW); Chi-Chih Liao, Taipei (TW); Jiun-Haw Lee, Taipei (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/248,553

(22) Filed: Jan. 29, 2003

(65) Prior Publication Data

US 2004/0144974 A1 Jul. 29, 2004

(51) Int. Cl.[7] ................................................ H01L 35/24
(52) U.S. Cl. ........................ 257/40; 257/79; 257/98; 257/99; 257/102; 257/103
(58) Field of Search ............................ 257/40, 79, 98, 257/99, 102, 103; 313/503, 504, 506

(56) References Cited

U.S. PATENT DOCUMENTS

| 6,097,147 A | * | 8/2000 | Baldo et al. | 313/506 |
| 6,573,651 B2 | * | 6/2003 | Adachi et al. | 313/504 |
| 2002/0074935 A1 | * | 6/2002 | Kwong et al. | 313/504 |
| 2002/0096995 A1 | * | 7/2002 | Mishima et al. | 313/506 |
| 2002/0180347 A1 | * | 12/2002 | Adachi et al. | 313/503 |
| 2003/0068525 A1 | * | 4/2003 | Bellmann et al. | 428/690 |
| 2003/0138657 A1 | * | 7/2003 | Li et al. | 428/621 |
| 2003/0162299 A1 | * | 8/2003 | Hsieh et al. | 436/84 |
| 2003/0218418 A9 | * | 11/2003 | Sato et al. | 313/504 |
| 2004/0028944 A1 | * | 2/2004 | Mori et al. | 428/691 |

* cited by examiner

*Primary Examiner*—Nathan J. Flynn
*Assistant Examiner*—Remmon R. Fordé
(74) *Attorney, Agent, or Firm*—Jiang Chyun IP Office

(57) ABSTRACT

An organic light emitting diode (OLED) device comprises a substrate, an anode layer, a luminescence layer, a hole blocking layer and a cathode layer. The anode layer is disposed on the substrate; the luminescence layer is disposed on the anode layer; the hole blocking layer is disposed on the luminescence layer; the cathode layer is disposed on the hole blocking layer. In addition the luminescence layer comprises a hole transporting material and a phosphorescent material, wherein the weight percentage of the bole transporting material and the phosphorescent material is between 40%~60%.

24 Claims, 2 Drawing Sheets

ORGANIC LIGHT EMITTING DIODE DEVICE WITH ORGANIC HOLE TRANSPORTING MATERIAL AND PHOSPHORESCENT MATERIAL

BACKGROUND OF INVENTION

1. Field of Invention

The present invention relates to organic light emitting diode (OLED) device. More particularly, the present invention relates to an organic light emitting diode (OLED) device having a light emitting layer fabricated by doping an organic material layer with hole transporting material and phosphorescent material.

2. Description of Related Art

Due to rapid growth in the communication industry, portable equipment is a major center of development. Flat displays have become the principal human-machine interface. In general, flat panel displays are divided according to the types of techniques into plasma display panel (PDP), liquid crystal display (LCD), electro-luminescent display, light emitting diode (LED), vacuum fluorescent display, field emission display (FED), electro-chromic display and organic light emitting diode (OLED) display. Among various types of displays, organic light emitting diode (OLED) display has the greatest potential to become the dominant flat panel display in the next generation. An OLED display has many advantages including self-illuminating, no viewing angle retention, low energy consumption, easy to fabricate, low production cost, low operating temperature, quick response and full coloration.

An OLED device utilizes the self-illuminating property of organic functional materials to form images. According to the molecular weight of the organic functional material, OLED displays can be classified into small molecule OLED (SM-OLED) and polymer light-emitting device (PLED).

In general, luminance and light-emitting efficiency are the two major criteria for determining the quality of an OLED device. Researchers are always trying to increase the luminance and efficiency of OLED devices.

At present, the light-emitting layer inside the OLED display is made using fluorescent materials. However, fluorescent materials can hardly reach the desired level of luminance and efficiency. As a result, techniques making use of phosphorescent materials are proposed. Devices that utilizes phosphorescent materials can roughly be divided into two major categories:

(1) Phosphorescent materials are directly used in the light-emitting layer. In this type of display device, light-emitting efficiency (cd/A) will rapidly increase or decrease according to the applied voltage or current. However, the color index may change as luminance increases. Furthermore, most devices using phosphorescent material as the light-emitting layer is hardly able to produce the desired luminance at a low applied voltage;

(2) Phosphorescent material is doped as a guest material inside a host light-emitting material at 1% to 10%. Through the energy transfer of the host material, the guest phosphorescent material is illuminated to produce light. However, the color index may change as the luminance is increased. Ultimately, the degree of increase in luminance and light-emitting efficiency is quite limited.

SUMMARY OF INVENTION

Accordingly, one object of the present invention is to provide a light-emitting layer and an organic light emitting diode (OLED) device having such a light-emitting layer for increasing the luminance and light-emitting efficiency of the device.

A second object of this invention is to provide a light-emitting layer and an organic light emitting diode (OLED) device having such a light-emitting layer such that color index and light-emitting efficiency can be maintained at a constant level as applied voltage or current is increased. Hence, attenuation of the color index and light-emitting efficiency of the device is minimized.

To achieve these and other advantages and in accordance with the purpose of the invention, as embodied and broadly described herein, the invention provides a luminescence layer. The luminescence layer is an organic material layer comprising hole transporting material and phosphorescent material. The concentration of hole transporting material and phosphorescent material in the luminescence layer is between 40%~60% by weight. The organic material is either small molecule organic material or polymer organic material such as, for example, an iridium complex compound having an isoquinoline substituted radical. The hole transporting material is a compound having a tribenzoamide structure including, for example, NPB, TPD and TCTA. A hole blocking layer may also be formed over the luminescence layer. The hole blocking layer is fabricated from a material such as BCP, Balq, TAZ or TPBI.

This invention also provides an organic light emitting diode (OLED) device having a substrate, an anode layer, a luminescence layer, a hole blocking layer and a cathode layer. The anode layer is disposed on the substrate and the luminescence layer is disposed on the anode layer. The hole blocking layer is disposed on the luminescence layer and the cathode layer is disposed on over the hole blocking layer. In addition, the luminescence layer is an organic material layer comprising hole transporting material and phosphorescent material. The concentration of hole transporting material and phosphorescent material in the luminescence layer is between 40%~60% by weight.

In the OLED device of this embodiment, a hole injecting layer and a hole transporting layer may be inserted between the anode layer and the light-emitting layer by selection. The hole injecting layer is positioned between the anode layer and the light-emitting layer while the hole transporting layer is positioned between the hole injecting layer and the light-emitting layer. In addition, an electron injecting layer and an electron transporting layer may be inserted between the hole blocking layer and the cathode layer by selection. The electron injecting layer is positioned between the hole blocking layer and the cathode layer while the electron transporting layer is positioned between the electron injecting layer and the cathode layer.

In the OLED device of this embodiment, the hole injecting layer is fabricated from a material such as CuPc or m-MTDATA. The hole transporting layer is fabricated from a material having a tribenzoamide structure such as NPB, TPD or TCTA. The electron transporting layer is fabricated from a metal complex compound such as AlQ or BeBq2 or a mixture of cyclic compounds including PBD, TAZ or TPBI.

Furthermore, the anode layer on the substrate is a plurality of transparent electrodes each shaped into a longitudinal strip. The anode layer is fabricated using a transparent material such as indiumtin oxide, indiumzinc oxide or aluminumzinc oxide. The cathode layer is a plurality of metallic electrode each shaped into a longitudinal strip. The cathode layer is fabricated using a conductive material such as aluminum, calcium or magnesium-silver alloy. The hole blocking layer is fabricated from a material such as BCP, Balq, TAZ or TPBI.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
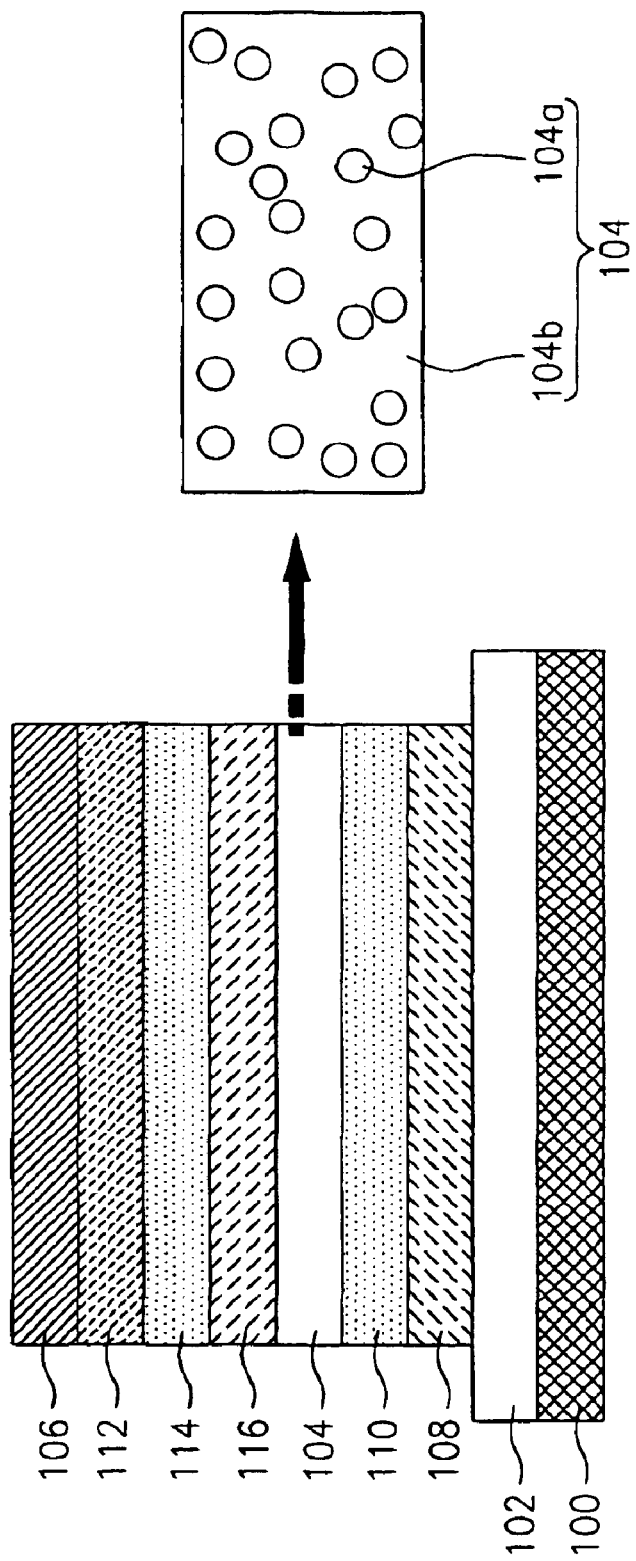
FIG. 1 is a schematic cross-sectional diagram of an organic light emitting diode device according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In most electro-luminescent systems, the light emission occurs under a singlet spinning of electron excited states or a triplet spinning of electron excited states. When the singlet spinning of electron excited state drops back to an unexcited state is referred to as fluorescence. The emission can be summarized using the formula:

$$S_1 \rightarrow S_0 + h\nu$$

On the other hand, when the triplet spinning of electron excited state drops back to the unexcited state is referred to as phosphorescence. The emission can be summarized using the formula:

$$T_1 \rightarrow S_0 + h\nu$$

The external quantum efficiency of an electro-luminescent process is given by the formula: $\phi\, EL = X \phi_f \eta_r \eta_e$, where X is the fraction of re-combinations that result in excitons, $\phi_f$ is the efficiency of injecting charges into the light-emitting layer, $\eta_r$ is the electron-hole recombination efficiency and $\eta_e$ is the transition efficiency.

When the singlet spinning of electron is in an excited state, the fraction of re-combinations that result in excitons X is 0.25. Assume all other efficiencies are 100% in the light emission process, the largest external quantum efficiency is actually only 25%. On the contrary, when the triplet spinning of electron is in a excited state, the fraction of recombinations that result in excitons X is 0.75. In other words, assume all other efficiencies are 100% in the light emission process, the largest external quantum efficiency reaches 75%.

Accordingly, using phosphorescent material to serve as a light-emitting material is guaranteed a higher light emission efficiency.

The OLED device in this embodiment uses phosphorescent material to produce light so that an optimal light-emitting efficiency is obtained. In addition, this invention also provides some improvements to rapid attenuation of light-emitting efficiency (cd/A) after an increase in applied voltage or current, change in color index that results from an increase in the luminance and the intrinsic low luminance and light-emitting efficiency of a conventional OLED device.

FIG. 1 is a schematic cross-sectional diagram of an organic light emitting diode device according to one preferred embodiment of this invention. As shown in FIG. 1, the OLED device is constructed over a substrate 100. The substrate 100 is a transparent substrate such as a glass substrate, a plastic substrate or a flexible substrate. An anode 102, a light-emitting layer 104, a cathode layer 106, a hole injecting layer (HIL) 108, a hole transporting layer (HTL) 110, an electron injecting layer (EIL) 112, an electron transporting layer (ETL) 114 and a hole blocking layer (HBL) 116 are sequentially positioned over the substrate 100. Note that the aforementioned hole injecting layer 108, the hole transporting layer 110, the electron injecting layer 112, the electron transporting layer 114 and the hole blocking layer 116 can be positioned on demand. In the following, relative positioning, states and material constituents of various film layers are described in more detail.

The anode layer 102 on the substrate 100 includes of plurality transparent electrodes each shaped into a longitudinal strip. The anode layer 102 is fabricated using a transparent material such as indiumtin oxide, indiumzinc oxide or aluminumzinc oxide. The hole injecting layer 108 is positioned to cover the anode layer 102 and is made from a material such as CuPr or m-MTDATA. The hole transporting layer 110 is positioned over the hole injecting layer 108 and is made from a material having a tribenzoamide structure such as NPB, TPD or TCTA.

The luminescence layer 104 is disposed on the hole transporting layer 110. The luminescence layer 104 is an organic material layer comprising hole transporting material 104b and phosphorescent material 104a. The luminescence layer 104 is fabricated using small molecule organic material or polymer organic material such as an iridium complex with isoquinoline substituted radical. The hole transporting material 104b is fabricated from a material having a tribenzoamide structure such as NPB, TPD or TCTA. In addition, the concentration of hole transporting material and phosphorescent material in the luminescence layer 104 is between 40%~60% by weight.

The hole blocking layer 116 is positioned over the light-emitting layer 104 and is fabricated from a material such as BCP, Balq, TAZ or TPBI. The principal function of the hole blocking layer 116 is to limit the movement of holes within the light-emitting layer 104 so that light-emitting efficiency is increased. The electron transporting layer 114 is positioned over the hole blocking layer 116 and is fabricated from a metal complex compound such as AlQ or BeBq2 or a mixture of cyclic compounds including PBD, TAZ or TPBI. The electron injecting layer 112 is positioned over the electron transporting layer 114 and the cathode layer 106 is positioned over the electron injecting layer 112. The cathode layer 106 includes plurality of metal electrodes each shaped into a longitudinal strip. The cathode layer 106 is fabricated using a conductive material such as aluminum, calcium or magnesium-silver alloy.

After the anode layer 102 and the cathode layer 106 of the OLED device are connected to a voltage, electrons will be injected from the cathode layer 106 into the LUMO layer inside the light-emitting layer 104 in the presence of an electric field to form negative ions. Similarly, holes will be injected from the anode layer 102 into the HOMO layer inside the light-emitting layer 104 to form positive ions. The positive ions and the negative ions move in opposite direction and recombine in the light-emitting layer 104 to form excitons. A portion of the excitons in the light-emitting layer 104 releases excess energy as photons by returning the ground state.

In this embodiment, the hole transporting material 104b has a lower concentration of HOMO compared with the phosphorescent organic material 104a. Hence, excess holes that has not recombined with electrons will be trapped in the hole transporting material 104b within the light-emitting layer 104 leading to the so-called hole trapping phenomena. Due to hole trapping, the probability of recombination between the holes and electrons constrained within the light-emitting layer 104 will increase (an increased probability of producing excitons). Therefore, using hole transporting material 104b in the light-emitting layer 104 to constrain the holes, color index of the phosphorescent material is improved and attenuation of the light-emitting efficiency is reduced aside from an increase in light-emitting efficiency and luminance of the OLED device. Additionally, a drastic increase in the color index due to an increase in voltage is also prevented.

Figure 2:
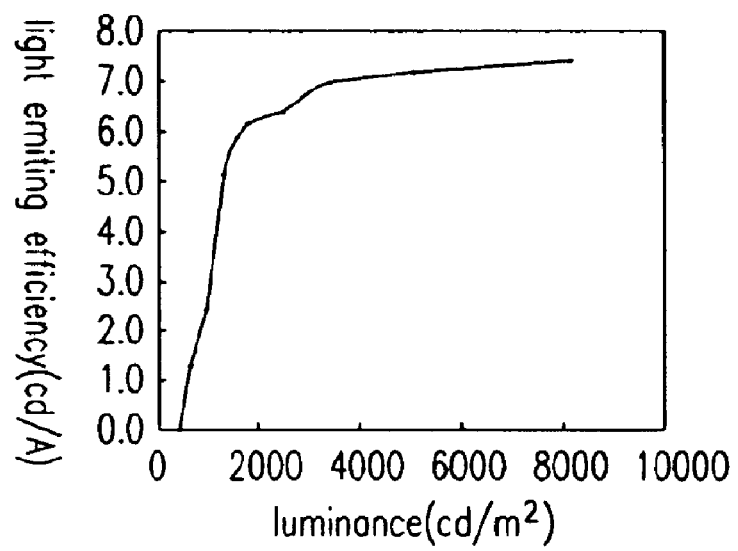
FIG. 2 is a graph showing the relationship between luminance and light-emitting efficiency of an organic light emitting diode device fabricated according to one preferred embodiment of this invention.
Figure 3:
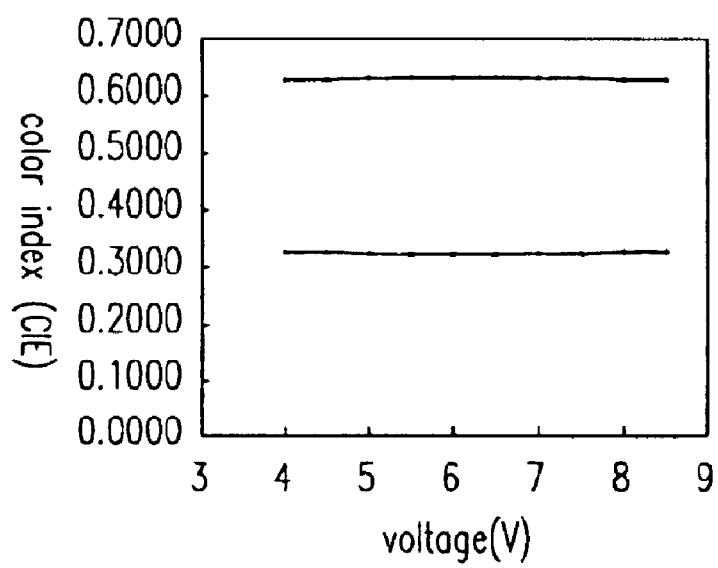
FIG. 3 is a graph showing the relationship between color index and applied voltage of an organic light emitting diode device fabricated according to one preferred embodiment of this invention.

FIG. 2 is a graph showing the relationship between luminance and light-emitting efficiency of an organic light emitting diode device fabricated according to one preferred embodiment of this invention. FIG. 3 is a graph showing the relationship between color index and applied voltage of an organic light emitting diode device fabricated according to one preferred embodiment of this invention. As shown in FIG. 2, this invention increases the light-emitting efficiency of the device to the highest level and reduces the attenuation rate of the light-emitting efficiency at the same time. As shown in FIG. 3, the color index remains constant despite an increase in the applied voltage.

In conclusion, the OLED device has at least the following advantages:

1. Using hole transporting material and phosphorescent material to serve as the light-emitting layer in the OLED device, both the luminance and light-emitting efficiency of the device is increased.

2. Using hole transporting material and phosphorescent material to serve as the light-emitting layer in the OLED device, the attenuation rate of both color index and light-emitting efficiency of the device is reduced.

3. The hole blocking layer in the OLED device is able to constrain holes in the light-emitting layer so that the probability of electron/hole recombination is increased. Ultimately, light-emitting efficiency is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic light-emitting diode (OLED) device, comprising:
   a substrate;
   an anode layer disposed on the substrate;
   a luminescence layer disposed on the anode layer, wherein the luminescence layer is an organic material layer is comprising hole transporting material and phosphorescent material, and that the concentration of hole transporting material and phosphorescent material is between 40~60% by weight;
   a hole blocking layer disposed on the luminescence layer; and
   a cathode layer disposed on the hole blocking layer.

2. The OLED device of claim 1, wherein the substrate includes a transparent substrate.

3. The OLED device of claim 1, wherein the anode layer includes a plurality of transparent electrodes each shaped into a longitudinal strip.

4. The OLED device of claim 3, wherein material constituting the transparent electrodes is selected from a group consisting of indiumtin oxide, indiumzinc oxide and aluminumzinc oxide.

5. The OLED device of claim 1, wherein the organic material includes small molecule organic material.

6. The OLED device of claim 1, wherein the organic material includes polymer organic material.

7. The OLED device of claim 1, wherein the organic material includes an iridium complex compound having an isoquinoline substituted radical.

8. The OLED device of claim 1, wherein the hole transporting material hats a tribenzoamide structure selected from a group consisting of NPB, TPD and TCTA.

9. The OLED device of claim 1, wherein material constituting the hole blocking layer is selected from a group consisting of BCP, Balq, TAZ and TPBI.

10. The OLED device of claim 1, wherein the cathode layer includes a plurality of metallic electrodes each shaped into a longitudinal strip.

11. The OLED device of claim 10, wherein material constituting the metallic electrodes is selected from a group consisting of aluminum, calcium and magnesium-silver alloy.

12. The OLED device of claim 1, wherein the device may further include a hole injecting layer between the anode layer and the luminescence layer.

13. The OLED device of claim 12, wherein the device may further include a hole transporting layer between the hole injecting layer and the luminescence layer.

14. The OLED device of claim 13, wherein material constituting the hole injecting layer is selected from a group consisting of CuPc and m-MTDATA.

15. The OLED device of claim 13, wherein material constituting the hole transporting layer has a tribenzoamide structure selected from a group consisting of NPB, TPD and TCTA.

16. The OLED device of claim 1, wherein the device may further include an electron transporting layer between the hole blocking layer and the cathode layer.

17. The OLED device of claim 16, wherein the device may further include an electron injecting layer between the electron transporting layer and the cathode layer.

18. The OLED device of claim 17, wherein material constituting the electron transporting layer is a metal complex selected from a group consisting of AIQ and BeBq2 or a complex cyclic compound selected from a group consisting of PBD, TAZ and TPBI.

19. A luminescence layer in an organic light emitting diode (OLED) device, wherein the luminescence layer is an organic material layer comprising hole transporting material and phosphorescent material and that the concentration of hole transporting material and phosphorescent material is between 40~60% by weight.

20. The light-emitting layer of claim 19, wherein the organic material includes small molecule organic material.

21. The light-emitting layer of claim 19, wherein the organic material includes polymer organic material.

22. The light-emitting layer of claim 19, wherein the organic material includes art iridiun complex compound having an isoquinoline substituted radical.

23. The light-emitting layer of claim 19, wherein the hole transporting material has a tribenzoamide structure selected from a group consisting of NPB, TPD and TCTA.

24. The light-emitting layer of claim 19, wherein material constituting the hole blocking layer is selected from a group consisting of BCP, Balq, TAZ and TPBI.

* * * * *